(12) United States Patent
Talledo (10) Patent No.: US 11,133,241 B2
(45) Date of Patent: Sep. 28, 2021

(54) SEMICONDUCTOR PACKAGE WITH A CAVITY IN A DIE PAD FOR REDUCING VOIDS IN THE SOLDER

(71) Applicant: STMICROELECTRONICS, INC., Calamba (PH)

(72) Inventor: Jefferson Talledo, Calamba (PH)

(73) Assignee: STMicroelectronics, Inc., Calamba (PH)

( * ) Notice: Subject to any disclaimer, the term of this patent is extended or adjusted under 35 U.S.C. 154(b) by 0 days.

(21) Appl. No.: 16/910,824

(22) Filed: Jun. 24, 2020

(65) Prior Publication Data

US 2020/0411417 A1 Dec. 31, 2020

Related U.S. Application Data

(60) Provisional application No. 62/868,435, filed on Jun. 28, 2019.

(51) Int. Cl.
*H01L 23/495* (2006.01)
*H01L 23/44* (2006.01)
(Continued)

(52) U.S. Cl.
CPC .... *H01L 23/49513* (2013.01); *H01L 21/4825* (2013.01); *H01L 21/565* (2013.01);
(Continued)

(58) Field of Classification Search
CPC ............... H01L 2924/181; H01L 24/49; H01L 23/49513; H01L 23/3114; H01L 23/4952; H01L 23/49548; H01L 21/4825; H01L 21/565; H01L 24/48; H01L 24/33; H01L 24/30
See application file for complete search history.

(56) References Cited

U.S. PATENT DOCUMENTS 6,455,355 B1 9/2002 Lin et al.
6,661,083 B2 * 12/2003 Lee ..................... H01L 23/3107
257/676
(Continued)

OTHER PUBLICATIONS

"AN1902—Assembly guidelines for QFN (quad flat no-lead) and SON (small outline no-lead) packages," NXP, Application Note, Rev. 8.0, Feb. 6, 2018, 51 pages.
(Continued)

*Primary Examiner* — Alonzo Chambliss
(74) *Attorney, Agent, or Firm* — Seed IP Law Group LLP (57) ABSTRACT

A semiconductor package having an aperture in a die pad and solder in the aperture coplanar with a surface of the package is disclosed. The package includes a die pad, a plurality of leads, and a semiconductor die coupled to the die pad with a die attach material. A cavity or aperture is formed through the die pad to expose a portion of the die attach material. Multiple solder reflows are performed to reduce the presence of voids in the die attach material. In a first solder reflow, the voids of trapped gas that form when attaching the die to the die pad are released. Then, in a second solder reflow, solder is added to the aperture coplanar with a
(Continued)

surface of the die pad. The additional solder can be the same material as the die attach material or a different material.

20 Claims, 6 Drawing Sheets

(51) Int. Cl.
  *H01L 23/48* (2006.01)
  *H01L 21/00* (2006.01)
  *H01R 9/00* (2006.01)
  *H05K 5/02* (2006.01)
  *H01L 23/31* (2006.01)
  *H01L 21/56* (2006.01)
  *H01L 21/48* (2006.01)
  *H01L 23/00* (2006.01)

(52) U.S. Cl.
  CPC ...... *H01L 23/3114* (2013.01); *H01L 23/4952* (2013.01); *H01L 23/49548* (2013.01); *H01L 24/30* (2013.01); *H01L 24/33* (2013.01); *H01L 24/49* (2013.01); *H01L 24/48* (2013.01); *H01L 2924/181* (2013.01)

(56) References Cited

U.S. PATENT DOCUMENTS

| | | | |
|---|---|---|---|
| 7,092,890 B2 | 8/2006 | Elliott et al. | |
| 8,426,254 B2 | 4/2013 | Tan et al. | |
| 8,686,545 B2 * | 4/2014 | Minamio | H01L 24/32 |
| | | | 257/675 |
| 9,613,941 B2 | 4/2017 | Xu et al. | |
| 2004/0217450 A1 * | 11/2004 | Li | H01L 23/3107 |
| | | | 257/666 |
| 2005/0046008 A1 * | 3/2005 | Gai | H01L 23/3107 |
| | | | 257/690 |
| 2006/0006510 A1 * | 1/2006 | Koduri | H01L 23/49551 |
| | | | 257/678 |
| 2013/0241041 A1 * | 9/2013 | Yu | H01L 21/568 |
| | | | 257/676 |
| 2019/0267310 A1 * | 8/2019 | Rodriguez | H01L 23/49548 |

OTHER PUBLICATIONS

"Recommendations for Board Assembly of Infineon Discrete Packages without Leads," Infineon, Revision 6.0, Aug. 29, 2018, 23 pages.

* cited by examiner

SEMICONDUCTOR PACKAGE WITH A CAVITY IN A DIE PAD FOR REDUCING VOIDS IN THE SOLDER

BACKGROUND

Technical Field

The present disclosure is directed to semiconductor devices and more particularly, semiconductor packages.

Description of the Related Art

Quad-flat no-leads ("QFN") semiconductor packages are known. Such packages physically and electrically connect integrated circuits to substrates, such as printed circuit boards. During operation, the integrated circuit produces heat, which is dissipated to avoid damage to the package. In known QFN packages, the heat produced by the integrated circuit is dissipated from the integrated circuit through the die pad to which the integrated circuit is coupled, and into the substrate or a thermal pad on the substrate. In attaching the integrated circuit to the die pad of the package, solder material is commonly used because of its high thermal conductivity. However, solder material has volatile components, such as flux, that create bubbles of gas that are trapped during solidification of the solder when coupling the integrated circuit to the die pad. Such bubbles of gas are referred to as solder voids. The voids can cause a displacement of electrical and thermal paths and a local concentration of power and heat, which reduce the efficiency of heat transfer and thus reduce the reliability and applicability of QFN packages. Larger packages with higher heat dissipation requirements are utilized in certain industries, such as in the automotive industry. However, solder voids are even more likely to form in these larger packages due to the increase in the amount of solder used to couple the integrated circuit to the die pad.

BRIEF SUMMARY

The present disclosure is directed to a semiconductor package or device including a die pad and leads. The package includes a semiconductor die coupled to the die pad, typically with a die attach material, such as solder, to aid in the transfer of heat. Wires are coupled between the semiconductor die and the leads to establish an electrical connection between the die and the leads. The semiconductor die, the die pad, and the leads are encapsulated in a plastic material to produce a package, with the plastic material protecting the electrical components. The die pad and the leads are exposed on a surface of the package to enable an electrical connection to be formed with the die and an exterior device.

In at least one embodiment, a cavity or aperture is formed through the die pad to expose a portion of the die attach material. Additional material, such as solder, is back filled into the aperture in two distinct steps. In a first step, the original die attach material is reheated, which allows any voids that formed during coupling of the semiconductor die to the die pad to be released. In the second step, a solder layer is formed on the die attach material to fill the aperture. In one example, the solder in the aperture is coplanar with the surface of the package, such that the package has exposed solder on the surface of the package in the place of the portion of the die pad that was removed when forming the aperture.

In one example, the material coupling the die to the die pad is the same as the material of the solder layer. In other examples, the material used for the die attach is different from the material used for the solder layer in the aperture. Using different solder for the solder layer and the die attach material may be advantageous to help establish a strong physical and electrical connection with an external device that the package is coupled to. Put another way, the external device that receives the package may have pre-formed solder on a surface facing the package. The solder used for the solder layer (e.g. the solder exposed on the surface of the package) can be the same as the pre-formed solder on the external device, thus ensuring that a strong physical and electrical connection is established between the various layers of solder.

The present disclosure further includes methods of forming such semiconductor packages, including coupling a semiconductor die to the die pad with the die attach material, coupling wires between the semiconductor die and the leads and encapsulating the resulting combination in a plastic material to form a package. Then, a cavity or aperture is formed through the die pad and the first reheating step discussed above is performed to release the voids in the solder. Then, the solder layer is formed in the aperture to fill the voids and the aperture. The solder layer can be the same material as the die attach material or a different material. In one example, the method includes forming vent holes in the die pad during the forming of the die pad, such that voids in the die attach material can escape through the vent holes when the semiconductor die is coupled to the die pad with the die attach material, which eliminates the first reheating step described above.

Known solutions to reduce solder voids include vacuum treatment while solder is a molten state and optimization of the solder reflow temperature profile to increase the likelihood that trapped gas can escape at vent areas. However, such solutions are inadequate for several reasons. For example, these solutions have a low success rate in that voids are often still present in the solder even after using one of these solutions. Further, such solutions are costly because they involve special equipment and experimental trials to optimize, which increases the cost of the resulting package without experience significant benefits.

BRIEF DESCRIPTION OF THE SEVERAL VIEWS OF THE DRAWINGS

For a better understanding of the embodiments, reference will now be made by way of example only to the accompanying drawings. In the drawings, identical reference numbers identify similar elements or acts. In some figures, the structures are drawn exactly to scale. In other figures, the sizes and relative positions of elements in the drawings are not necessarily drawn to scale. For example, the sizes, shapes of various elements and angles may be enlarged and positioned in the figures to improve drawing legibility.

DETAILED DESCRIPTION

The present disclosure is generally directed to semiconductor packages having a cavity or aperture in a die pad of the package with solder or other material in the cavity coplanar with a surface of the die pad. The cavity allows for solder voids in the solder to escape during solder reflows, thus reducing the presence of solder voids and increasing thermal performance of the package.

Figure 1:
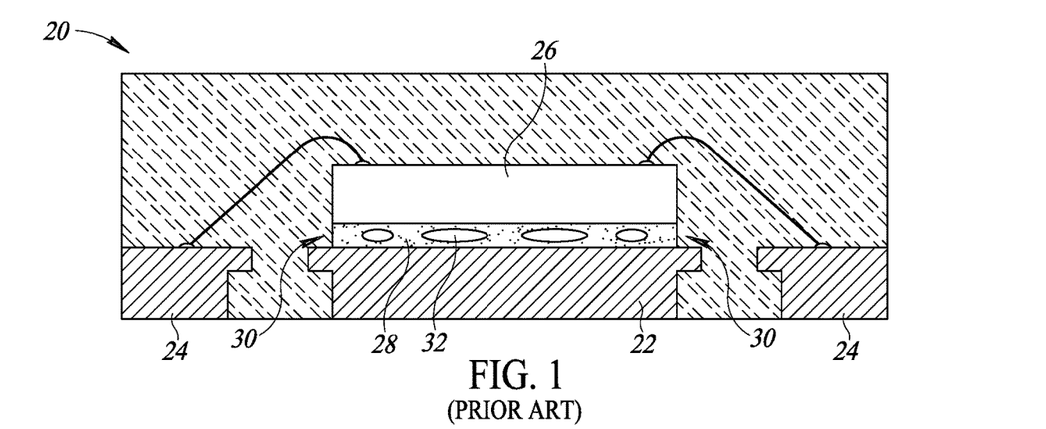
FIG. 1 is a cross-sectional view of a known semiconductor package illustrating voids in a die attach material.

FIG. 1 illustrates a known semiconductor package 20. The package 20 includes a die pad 22 and a plurality of leads 24. A semiconductor die 26 is coupled to the die pad 22 with a die attach material 28, which may be solder. Because the die pad 22 is typically a solid block of metal, the material 28 is only exposed to the ambient environment at sides 30 of the material 28. FIG. 1 illustrates the package 20 significantly enlarged for clarity. In actuality, a typical package 20 is on the order of a few millimeters in width, length, and thickness. As such, the area of die attach material 28 exposed at sides 30 is often significantly less than 1 mm. Thus, the vent area for the material 28 is insufficient and gas or air voids 32 form in the die attach material 28 as it solidifies. These voids 32 are randomly dispersed and differ in size and orientation throughout the material.

When electricity is provided to the package 20, the voids 32 cause a displacement of electrical and thermal paths and a local concentration of power and heat around the voids 32. This concentration of power and heat causes issues for the package 20 over the life cycle of the package 20, which typically includes hundreds, if not thousands, or more, of power cycles. Such issues can include delamination of the die attach material 28 from one of the die 26 and the die pad 22, or delamination of the die 26 from the die pad 22, which can both lead to package failure if contaminants, such as water or dirt are allowed to enter the separated package 20. Other issues include shorting, overheating, or melting of the electrical components of the package 20. These problems are only exacerbated in larger packages, as the die attach material 28 in the middle of the package is even further from the vents at the sides 30, thus increasing the likelihood of formation of voids 32.

Figure 2:
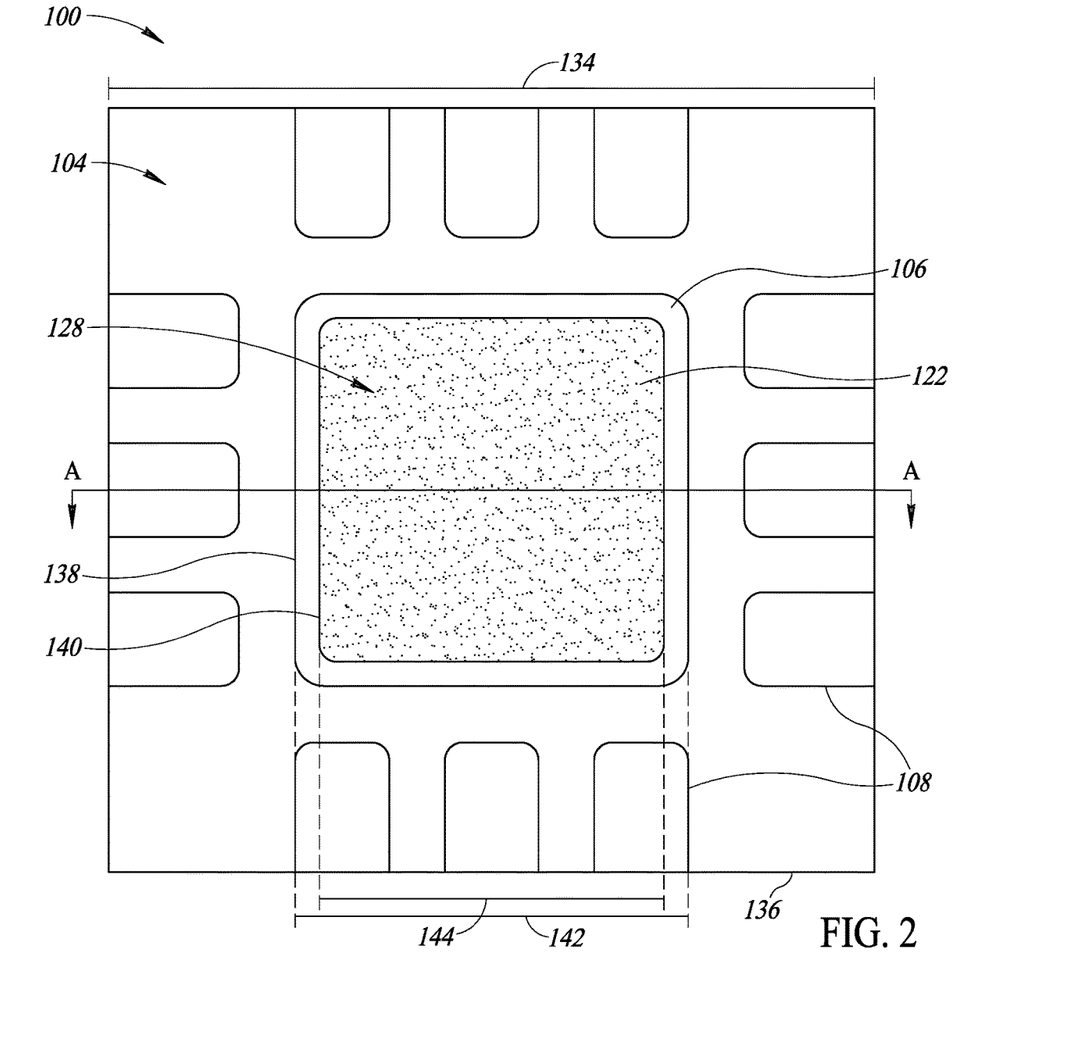
FIG. 2 is a plan view of an embodiment of a semiconductor package according to the present disclosure illustrating solder exposed on a surface of the semiconductor package.
Figure 3:
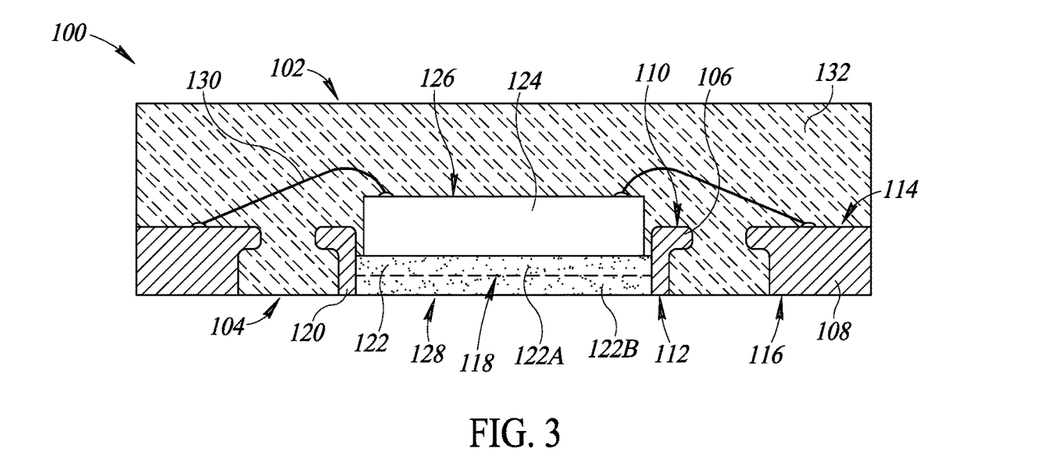
FIG. 3 is a cross-sectional view of the semiconductor package of FIG. 2.

FIGS. 2 and 3 illustrate an embodiment of a semiconductor package 100 according to the present disclosure, which includes a first surface 102 and a second surface 104 opposite the first surface 102. Specifically, FIG. 2 illustrates a plan view of the second surface 104 of the package 100 and FIG. 3 illustrates a cross-sectional view of the package 100 along the line A-A in FIG. 2. The package 100 includes a lead frame comprising a die pad 106 spaced from a plurality of leads 108. In one embodiment, the die pad 106 is a die pad area. The die pad 106 includes a first surface 110 and a second surface 112 opposite the first surface 110. Similarly, the plurality of leads 108 include a first surface 114 and a second surface 116 opposite the first surface 114. In one embodiment, the surfaces 110, 112 of the die pad 106 are coplanar with the surfaces 114, 116 of the leads 108. As such, a first surface of the lead frame includes the first surface 110 of the die pad 106 as well as the first surface 114 of the leads 108 and a second surface of the lead frame includes the second surface 112 of the die pad 106 and the second surface 116 of the leads 108.

In one embodiment, the second surface of the lead frame is coplanar with the second surface 104 of the package 100. The die pad 106 further includes a cavity or aperture 118 extending through the die pad 106 from the first surface 110 to the second surface 112 of the die pad 106. The cavity 118 defines sidewalls 120 of the die pad 106, which extend around a periphery of the die pad 106, as shown in FIG. 2. In other words, the cavity 118 is preferably centrally disposed with respect to the die pad 106 to define a plurality of sidewalls 120, which may also be referred to as a single sidewall including a plurality of walls, extending from the first surface 110 to the second surface 112 of the die pad 106.

A die attach material 122 is in the cavity 118 of the die pad. The die attach material 122 couples a semiconductor die 124 to the die pad 106, and more specifically, to the sidewall 120 of the die pad 106. As will be described further, the die attach material 122 includes a first layer of material 122A, which may be a die attach material, such as solder, for example, which couples the die 124 to the die pad 106. Preferably, the first layer of material 122A extends between the sidewalls 120 of the die pad 106. Then, a second layer of material 122B is formed on the first layer 122A to fill the cavity 118. In one embodiment, the layers of material 122A, 122B are the same and as such, in the composite product a boundary line between the layers may not be distinguishable. Here, a boundary between the layers 122A, 122B is denoted by a dashed line for clarity. In other embodiments where the layers 122A, 122B are different, a more clear boundary would appear in a cross-sectional view. The die attach material 122 has a first surface 126 and a second surface 128.

In one embodiment, the first surface 126 of the die attach material 122 is in the cavity 118 of the die pad 106 on the die 124 (e.g. between the first and second surfaces 110, 112 of the die pad 106) and the second surface 128 of the die attach material 122 is coplanar with the second surface 104 of the package 100. As such, in FIG. 2, the die attach material 122 is exposed on the second surface 104 of the package 104 to the ambient environment. In other embodiments, the die attach material 122 is not coplanar with the second surface 104 of the package 100, but rather, the die attach material 122 extends beyond the second surface 104 of the package 100 or the die attach material 122 has a thickness such that the die attach material 122 does not completely fill the cavity 118. Further, it is to be appreciated that while the layers of material 122A, 122B are illustrated in FIG. 3 as having the same thickness, that a thickness of each layer 122A, 122B can be selected. For example, the thickness of layer 122A may be more or less than the thickness of layer 122B.

As shown in FIG. 3, the package 100 further includes a plurality of wires 130 coupled between the die 124 and the plurality of leads 108. In one embodiment, the plurality of wires 130 are any type of metal wire and are bonded between the leads 108 and the die 124 with solder. In other embodiments, one or more of the wires 130 are formed from a conductive paste (e.g. an adhesive with entrained metal particles) and sintered or solidified in place. In such embodiments, a sacrificial layer may be used under the uncured conductive paste to establish a connection path between the leads 108 and the die 124, wherein the sacrificial layer evaporates as the wires 130 are cured. An encapsulant 132 is formed over the leads 108, the wires 130, the die 124, and the die pad 106. The encapsulant 132 may be a polymer, a plastic, a thermoplastic, a resin, any combination thereof, or the like.

In one embodiment, the package 100 is square, such that a length 134 of each side 136 of the package 100 is equal or substantially equal. Further, the die pad 106 and the cavity 118 are preferably square as well, as shown in FIG. 2. The die pad 106 includes a perimeter or outermost edge 138, which may also be referred to as a first edge, and an inner edge 140, which may also be referred to as a second edge. In one embodiment, a length or dimension 142 of each side of the die pad 106 along the perimeter edge 138 is greater than a length or dimension 144 of each side of the inner edge 140. As such, an area of the die pad 106 defined by the perimeter edge 138 is greater than an area of the cavity 118 as defined by the inner edge 140. However, other embodiments of the present disclosure include other package and die pad shapes, including square or circular, for example, as well as die pads with edges of different size relative to the cavity or aperture.

Figure 4:
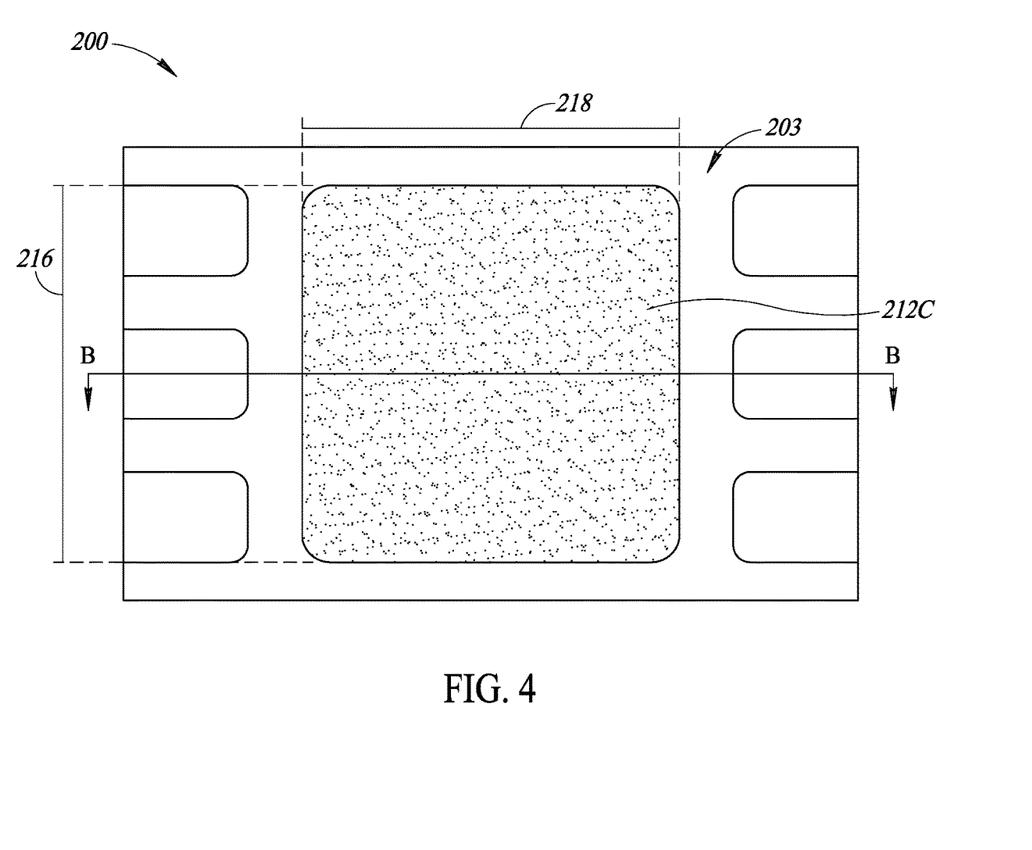
FIG. 4 is a plan view of an alternative embodiment of a semiconductor package according to the present disclosure illustrating solder exposed on a surface of the semiconductor package.
Figure 5:
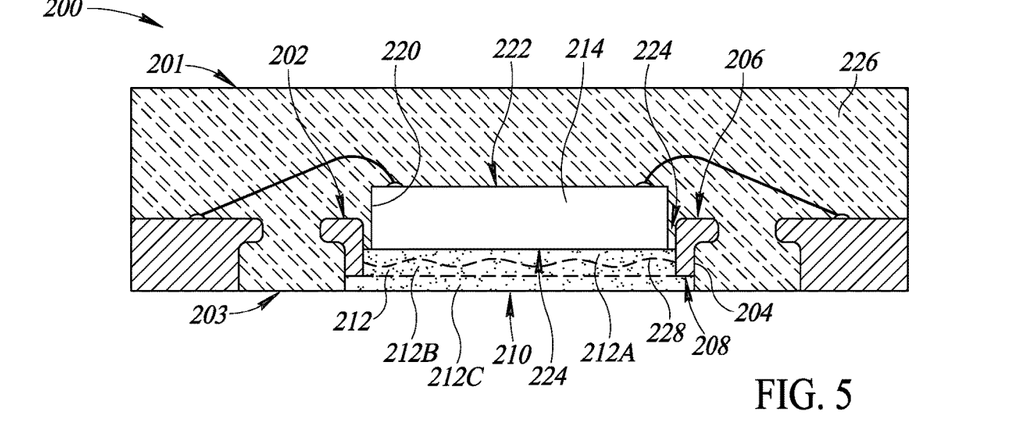
FIG. 5 is a cross-sectional view of the semiconductor package of FIG. 4.

FIGS. 4 and 5 illustrate an alternative embodiment of a semiconductor package 200. Certain aspects of the package 200 are identical to the package 100 and as such, redundant disclosure has been omitted in the interest of brevity and to avoid obscuring features of the embodiments.

The package 200 includes a first surface 201 and a second surface 203 opposite the first surface 201 and a die pad 202 defined by sidewalls 204 of the die pad 202. FIG. 4 illustrates the second surface 203 of the package 200 and FIG. 5 is a cross-sectional view of the package 200 through line B-B in FIG. 4. The die pad 202 includes a first surface 206 and a second surface 208 opposite the first surface 206 and an aperture 210 extending through the die pad 202 from the first surface 206 to the second surface 208 of the die pad 202. A die attach material 212 is formed in the aperture 210. The die attach material 212 can include a plurality of layers 212A, 212B, and 212C. Specifically, the first layer 212A is in the aperture 210 and on the die 214. The first layer 212A is formed with a first solder reflow to couple the die 214 to the die pad 202 before formation of the aperture 210. Then, the aperture 210 is formed, and a second solder reflow process is performed to release solder voids in the first layer 212A. The aperture 210 can be formed with a single mask and a wet or dry etch, or with multiple etching steps. In other embodiments, the aperture 210 is formed by laser or mechanical cutting, for example.

Because the aperture 210 extends across most, or all of, the die pad 202, there is significantly more vent area for the solder voids compared to known packages. In the second solder reflow, additional solder can be added as the second solder layer 212B. Dashed line 228 represents the interface between the first and second layers 212A, 212B. Because the release of the voids in the first layer 212A may create an uneven surface facing the second layer 212B, dashed line 228 includes several curved portions to represent cavities at a surface of the first layer 212A that may remain after the solder voids are vented. Finally, the third layer 212C is formed on the second layer 212B and preferably coplanar with the second surface 203 of the package. As shown in FIG. 5, the third layer 212C has a larger area than the first and second layers 212A, 212B. The layers 212A, 212B, 212C are added sequentially, as above, which allows for gas in the solder to vent before the next layer is added. As such, each layer in the package 200 will have significantly less solder voids (e.g., 80% less, 90% less or more in various embodiments) compared to known packages. Moreover, embodiments of the present disclosure include more than two layers of die attach material 212 in the aperture 210, such as three, four, five, or more layers, which can be selected according to the application of the package 200.

In FIG. 5, an area of an opening the aperture 210 and thus the third layer of material 212C is at least equal to an area of the die pad 202. In other words, the aperture 210 and the third layer of material 212C have a first area defined by a first dimension 216 and a second dimension 218 and the die pad 202 includes a second area defined by an outer edge of the sidewalls 204 of the die pad 202. The first area is preferably equal or substantially equal to the second area. In one embodiment, the first area is greater than the second area. In the illustrated embodiment, a portion of the third layer of material 212C is under the sidewalls 204 of the die pad 202 and is coplanar with an outer surface of the sidewalls 204 of the die pad 202.

The second surface 203 of the package 200 includes the second layer 212B of material 212 exposed to the ambient environment. In one embodiment, the die pad 202 is not visible on the second surface 203 of the package 200 regardless of viewing orientation, as in FIG. 4. The package 200 further includes the die 214 having sidewalls 220 extending between a first surface 222 and a second surface 224 of the die 214. The die pad 202 that receives the die 214 has a greater area than an area of the die 214 between the sidewalls 220. As such, there is a gap or space 224 between sidewalls 220 of the die and sidewalls 204 of the die pad 202. In one embodiment, molding compound 226 fills the gap or space 224 in the package 200. However, when coupling the die 214 to the die pad 202, the gap 224 provides clearance to prevent damage to the die 214 by contacting the die 214 with the sidewalls 204 of the die pad 202. In other words, the gap 224 prevents chipping or cracking of the die 214 when attaching or coupling the die 214 to the die pad 202 with the die attach material 212.

Figure 6:
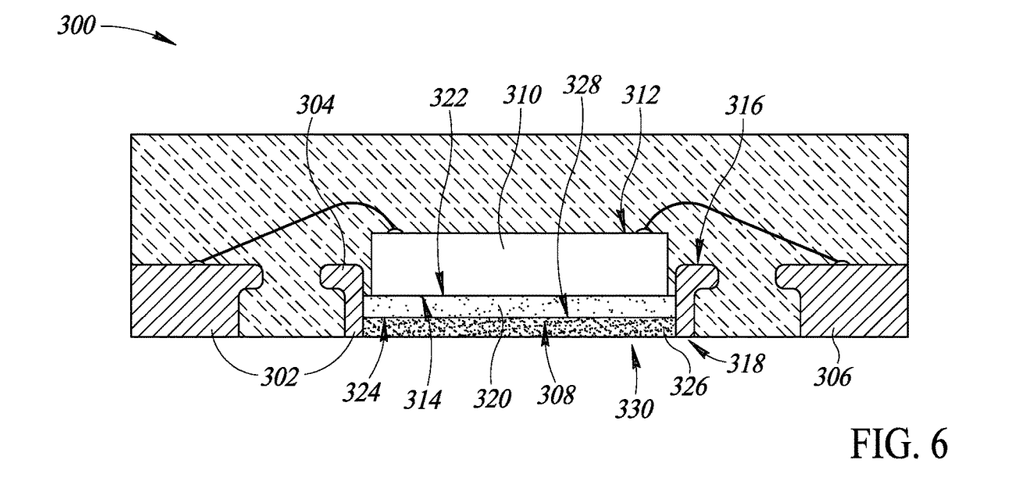
FIG. 6 is a cross-sectional view of an alternative embodiment of a semiconductor package according to the present disclosure illustrating layers of different material in an aperture of a die pad.

FIG. 6 illustrates an alternative exemplary embodiment of a package 300. The package 300 may be identical in several respects to the package 100 described with reference to FIGS. 1 and 2 and as such, redundant description has been omitted. The package 300 includes a lead frame 302 including a die pad 304 and a plurality of leads 306. A hole 308 extends through the die pad 304. The package 300 includes a semiconductor device 310, such as a semiconductor die, received in the hole 308. Put another way, the semiconductor device 310 includes a first surface 312 opposite a second surface 314 and the die pad 304 includes a first surface 316 opposite a second surface 318. The second surface 314 of the semiconductor device 310 is positioned in the hole 308 between the first and second surface 316, 318 of the die pad 304, which may also be referred to as a first and second surface of the lead frame 302. A first material 320 is in the hole 308 on the second surface 314 of the semiconductor device 310. The first material 320 has a first surface 322 and a second surface 324, wherein the first surface 322 of the first material 320 is between the first and second surfaces 316, 318 of the die pad 304 on the semiconductor device 310.

A second material 326 is on the first material 320. In the illustrated embodiment, the second material 326 is below the first material 320. More specifically, the second material 326 includes a first surface 328 and a second surface 330, wherein the first surface 328 of the second material 326 is on the second surface 324 of the first material 320 and the second surface 330 of the second material 326 is coplanar with a surface of the package 300, as described herein. In one embodiment, the first and second materials 320, 326 are the same solder, in which case, the materials 320, 326 may generally be referred to as a single material, or a single material with two layers 320, 326, wherein the second surface 330 of the combined material is coplanar with a surface of the package 300. In other embodiments, the materials 320, 326 are different. For example, the first material 320 may be a first type of solder and the second material 326 may be a second, different type of solder with different thermal, electrical, and bonding characteristics than the first type of solder.

Figure 7A:
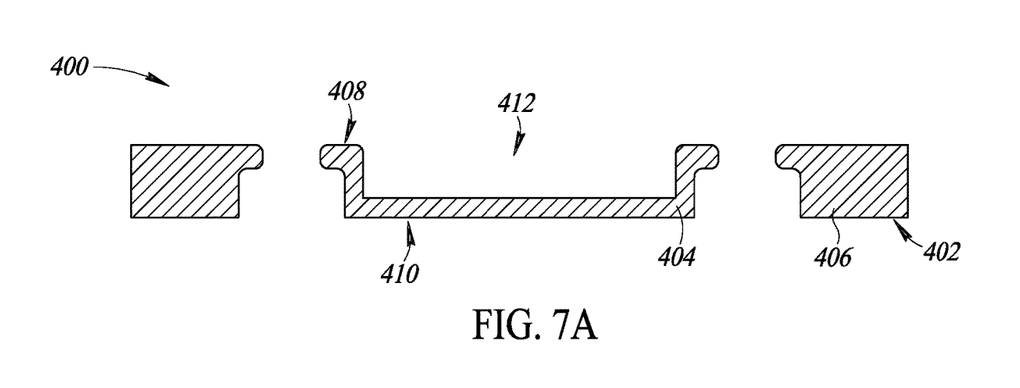
FIGS. 7A-7F are cross-sectional views of an embodiment of a method according to the present disclosure for forming a semiconductor package with an aperture in a die pad and material in the aperture coplanar with a surface of the package.

FIGS. 7A-F illustrate an embodiment of a method for forming a semiconductor package 400 of the type described herein. While FIGS. 7A-F illustrate the formation of one package, it is to be appreciated that the method can be performed to form hundreds of packages at the same time, wherein the last step is singulation of the composite structure containing numerous packages into singular packages through mechanical or laser cutting, or different types of etching, for example. FIG. 7A illustrates a lead frame 402, which includes a die pad 404 spaced from a plurality of leads 406. The lead frame 402 may be formed from a solid sheet of material by wet or dry etching, mechanical cutting, or laser cutting for example. The die pad 404 includes a first surface 408 opposite a second surface 410 and a cavity 412 extending into the die pad 404 from the first surface 408. As with the lead frame 402, the cavity 412 may be formed by etching, among other processes.

Figure 7B:
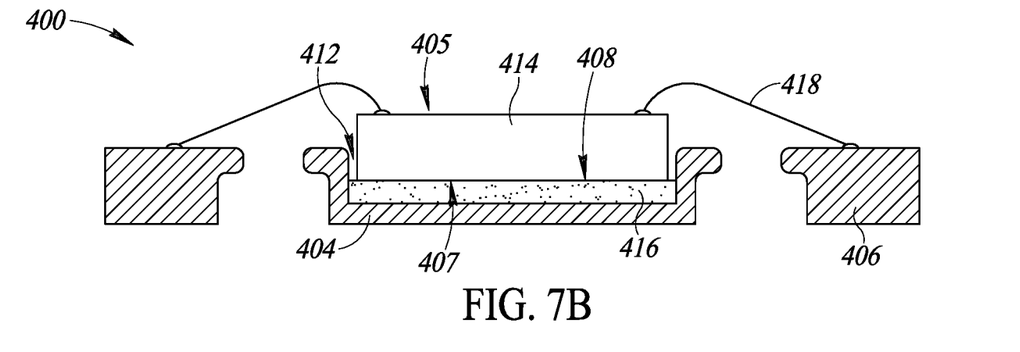

In FIG. 7B, a semiconductor die 414 is coupled to the die pad 404 and more specifically, to the first surface 408 of the die pad 404 in the cavity 412 of the die pad 404. The die 414 is coupled to the die pad 404 with a die attach material 416, which may be solder, for example. The die attach material 416 is between the first surface 408 of the die pad 404 and the die 414. As described above, an area of an opening of the cavity 412 is greater than an area of the die 414 and as such, there is a gap or space between edges of the die 414 and the die pad 404 to prevent damage to the die 414 during coupling. Once the die 414 is attached, a plurality of wires 418 are coupled between the die 414 and the leads 406 to establish an electrical connection between the same. As shown in FIG. 7B, the die 414 is received in the cavity 412, or in other words, a first surface 405 of the die 414 is positioned above a first surface 408 of the die pad 404 and the lead frame 402 generally while a second surface 407 of the die 414 is between the first and second surfaces 408, 410 of the die pad 404 and the lead frame 202.

Figure 7C:
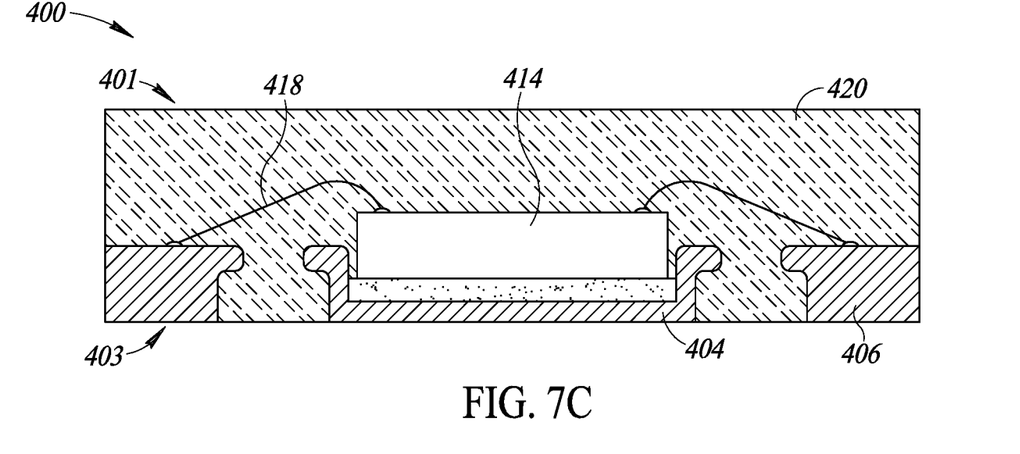

In FIG. 7C, an encapsulant 420 is formed over the die 414, the wires 418, the die pad 404, and the leads 406 to form the package 400 having a first surface 401 opposite a second surface 403. Formation of the encapsulant 420 can be accomplished by any number of conventional methods.

Figure 7D:
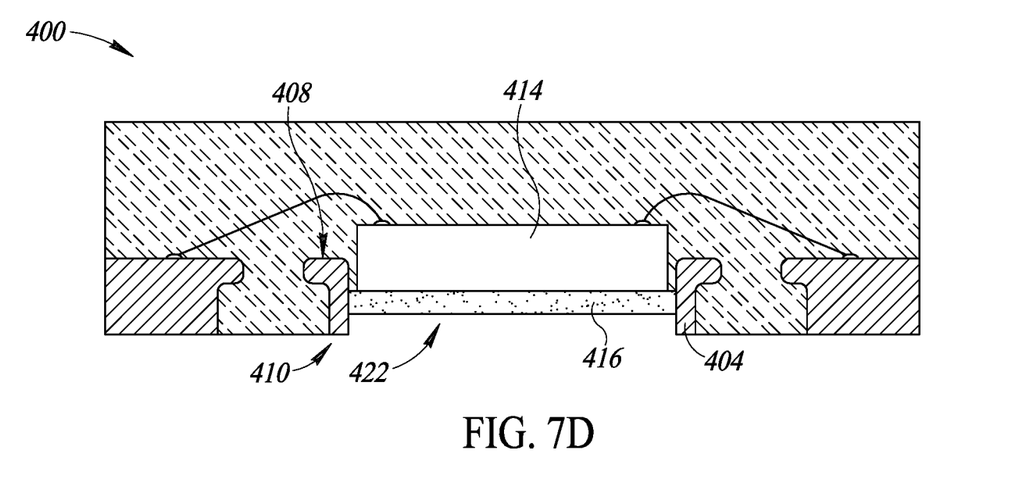

The method continues in FIG. 7D by removing a portion of the die pad 404. More specifically, an aperture 422 is formed through the die pad 404 from the second surface 410 to the first surface 408 of the die pad 408 to expose at least a portion of, or an entire surface of, the die attach material 416. In one embodiment, the aperture 422 is formed to correspond to a location of the die 414, while in other embodiments, the aperture 422 is offset from the die 414. Further, in one embodiment, the aperture 422 has an area greater than an area of the die 414, while in other embodiments, the area of the aperture 422 is equal to or less than the area of the die 414. In FIG. 7D an area of the aperture 422 is less than an area of the die pad 404, while in other embodiments, the area of the aperture 422 is greater than or equal to the area of the die pad 404 on a surface of the package.

Further, it is to be appreciated that because the aperture 422 is preferably formed by etching, that the aperture 422 can be formed to selected depths relative to the die pad 404. For example, in one embodiment, the aperture 422 is formed to remove only a portion of the die pad 404, while in other embodiments, etching can be selectively performed to remove a portion of the die attach material 416 as well. Removing a portion of the die attach material 416 may be advantageous to remove any voids in the die attach material 416 proximate the die pad 404 (e.g. at a surface of the die attach material 416 facing the die pad 404).

Figure 7E:
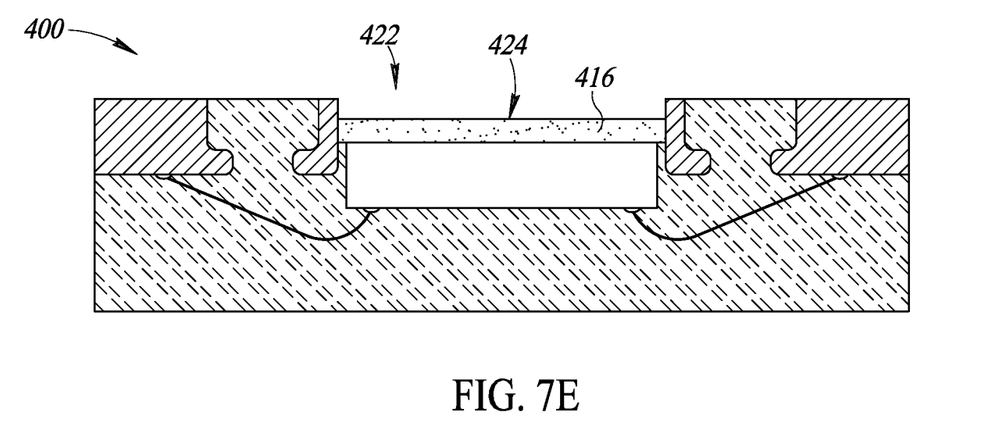

Then, in FIG. 7E, the package 400 is flipped and a solder reflow is performed to release any voids in the die attach material 416. In one embodiment, the solder reflow includes reheating the die attach material 416 until it is at least partially molten liquid, at which point, the voids can escape through the aperture 422, which is a considerably larger vent area than at sides of the package 400, as described with reference to FIG. 1. Preferably, the solder reflow includes heating the die attach material 416 until all or substantially all of the die attach material 416 is in a molten, liquid state. There is a much higher likelihood of the voids escaping the package 400 as compared to known packages because a vent area of the die attach material 416 and the aperture 422 (e.g. an area corresponding to the exposed portion of the die attach material 416 via the aperture 422) is two, three, four, five, six, seven, eight, nine, ten, or more times greater than a vent area at sides of the package in FIG. 1.

Thus, as the die attach material 416 is reheated, the gas in the voids tends to move to a surface 424 of the die attach material 416 that is at a top of the package 400 according to known principles of density. In other words, because the ambient environment surrounding the exposed die attach material 416 is less dense than the heated gas in the voids via the first solder reflow, the gas will naturally navigate towards the surface 424 of the die attach material 416 to be released. In an alternative embodiment, the first solder reflow includes adding a thin layer of solder (relative to the die attach material 416) on the die attach material 416 to fill any surface cavities that remain after the gas voids are released through the surface 424.

Figure 7F:
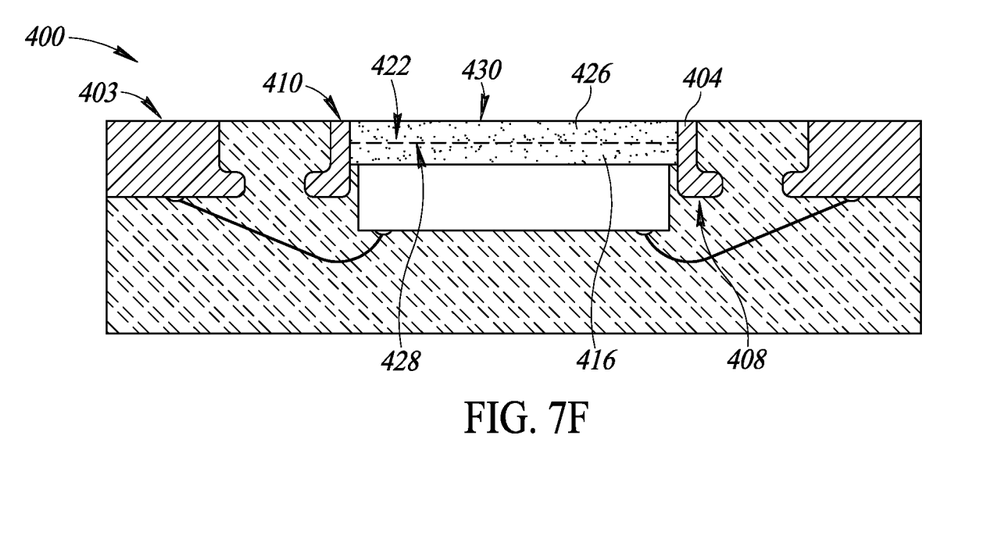

Then, in FIG. 7F, a material 426 is formed in the aperture 422 on the die attach material 416. As described herein, the material 426, which may also be a layer of material, has a first surface 428 opposite a second surface 430, wherein the first surface 428 is on the die attach material 416 in the aperture 422 between the first and second surfaces 408, 410 of the die pad 404 and the second surface 430 is coplanar or flush with the second surface 403 of the package 400 to facilitate coupling the package 400 to an external device, such as a substrate.

As such, the method includes multiple solder reflows, in conjunction with increased vent area at the aperture 422 in the die pad 404 to release the solder voids and back fill solder such that the package 400 can be coupled to an external device. Specifically, a first solder reflow is performed in FIG. 7B to couple the die 414 to the die pad 404 with the die attach material 416, which may be solder. Then, after forming the aperture 422, a second solder reflow is performed to release the voids in the die attach material 416 through the expanded vent area enabled by the aperture 422. The second reflow may or may not include adding additional solder. Finally, a third solder reflow fills the aperture 422 with material 426 such that the material 426 is coplanar with the second surface 403 of the package 400. Because the aperture 422 is open to the ambient environment, any trapped gas in the material 426 will be vented without additional solder reflows. In other words, the aperture 422 provides a sufficient vent area to reduce or prevent formation of solder voids in the material 426 added during the third solder reflow. In one embodiment, forming the material 426 includes the material 426 being the same solder material as the die attach material 416. As such, the combination of the die attach material 416 and the material 426 is a single, contiguous layer of solder with different portions corresponding to the different solder reflows. In other embodiments, these materials are different.

Figure 8:
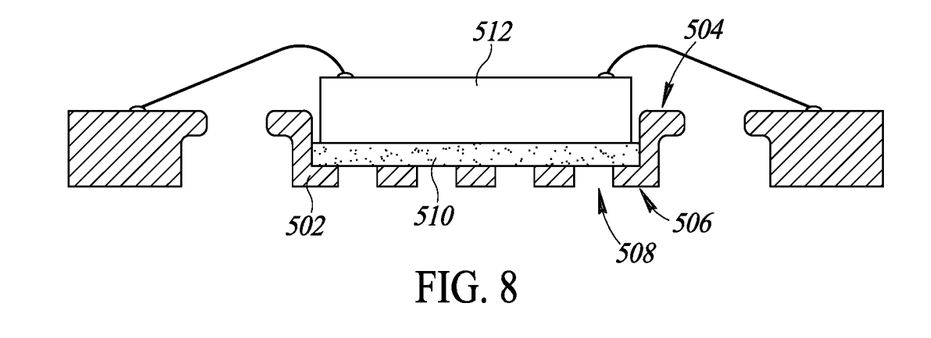
FIG. 8 is a cross-sectional view of an alternative embodiment of a semiconductor package according to the present disclosure with one or more vent holes in the die pad.

FIG. 8 illustrates an alternative embodiment of a method for forming a package, such as package 400 described with reference to FIGS. 7A-F. Specifically, the method includes forming a plurality of vent holes 508 in a die pad 502, wherein each vent hole 508 extends through the die pad 502 from a second surface 506 to a first surface 504 of the die pad 402. Preferably, the vent holes 508 are formed before coupling a die 512 to the die pad 502. In other words, FIG. 8 illustrates an alternative method to that described in FIG. 7A, as the vent holes 508 are formed in the die pad 502, which may be part of a lead frame, before the die 512 is coupled to the die pad 502. The vent holes 508 increase a vent area to allow gas trapped in the die attach material to escape. While the vent holes 508 are exaggerated in size in FIG. 8 for ease of recognition, it is to be appreciated that the vent holes 508 are, in actuality, small enough that a die attach material 510, which may be solder, for example, will not escape through the vent holes 508.

Further, while only four vent holes 508 are shown in FIG. 8, it is to be appreciated that the plurality of vent holes 508 can include tens, if not hundreds of vent holes 508 across the die pad 502. The vent holes 508 may be formed by wet or dry etching or by laser cutting, for example. After formation of the vent holes 508, the method described with reference to FIGS. 7A-F proceeds according to the same procedure, except that the solder reflow described with reference to FIG. 7E to release the gas voids may not be necessary. In other words, because the gas in the die attach material 510 in this embodiment can escape through the vent holes 508 during solidification of the die attach material 510, the solder reflow to release the same in FIG. 7E may not be needed. Then, the vent holes 508 can be removed by etching or cutting to form the aperture 422, as described herein. Because the vent holes 508 can be pre-formed in the die pad 502 before coupling the die 414 to the die pad 404, the embodiment of FIG. 8 results in a more efficient method than that described with reference to FIGS. 7A-F because the method of FIG. 8 involves one less solder reflow step (e.g. two total instead of three total).

In one embodiment, the vent holes 508 are formed before coupling the die 512 to the die pad 502, as above. In other embodiments, the vent holes 508 are formed instead of the aperture 422 described with reference to FIG. 7D. In other words, an alternative embodiment of a method proceeds as described until FIG. 7D, at which point, the vent holes 508 are formed in the die pad 502 instead of the aperture 422. In this embodiment, the solder reflow described in FIG. 7E is performed, wherein the trapped gas is allowed to escape through the vent holes 508 instead of through the aperture 422. Then, in FIG. 7F, the material 426 is added to fill the vent holes 508 during a solder reflow step, such that the resulting package includes alternating sections of die pad 502 and material 426 in the vent holes 508.

Figure 9:
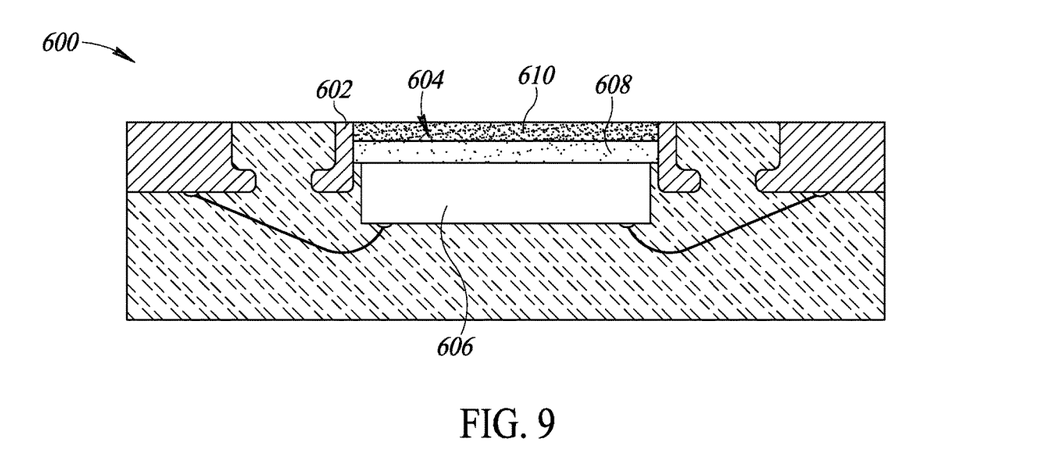
FIG. 9 is a cross-sectional view of an alternative embodiment of a method for forming a semiconductor package with an aperture in a die pad and solder material in the aperture that is different from die attach material coupling a semiconductor die to the die pad.

FIG. 9 is yet a further alternative embodiment of a method for forming a package 600, which may be similar to package 400, except as otherwise described. The method proceeds as described with reference to FIGS. 7A-F, except that in this embodiment, the package 600 includes a first material 608 on a semiconductor die 606 in an aperture 604 in a die pad 602 and a second material 610 on the first material 608. In this embodiment, the first material 608 and the second material 610 are different. For example, the first material 608 may be a solder including tin and lead and the second material 608 may be a lead-free solder, such as a solder including tin, silver, and copper. In other embodiments, the first material 608 is the lead-free solder and the second material 610 is the tin and lead solder. In yet further embodiments, the first material 608 is a lead-free solder with a first combination of tin, silver, and copper and the second material 610 is a lead-free solder with a second, different combination of tin, silver, and copper. As such, embodiments of the present disclosure are not limited by the type of solder used for the first material 608 and the second material 610, but rather, the materials can be selected according to application of the package 600.

Figure 10:
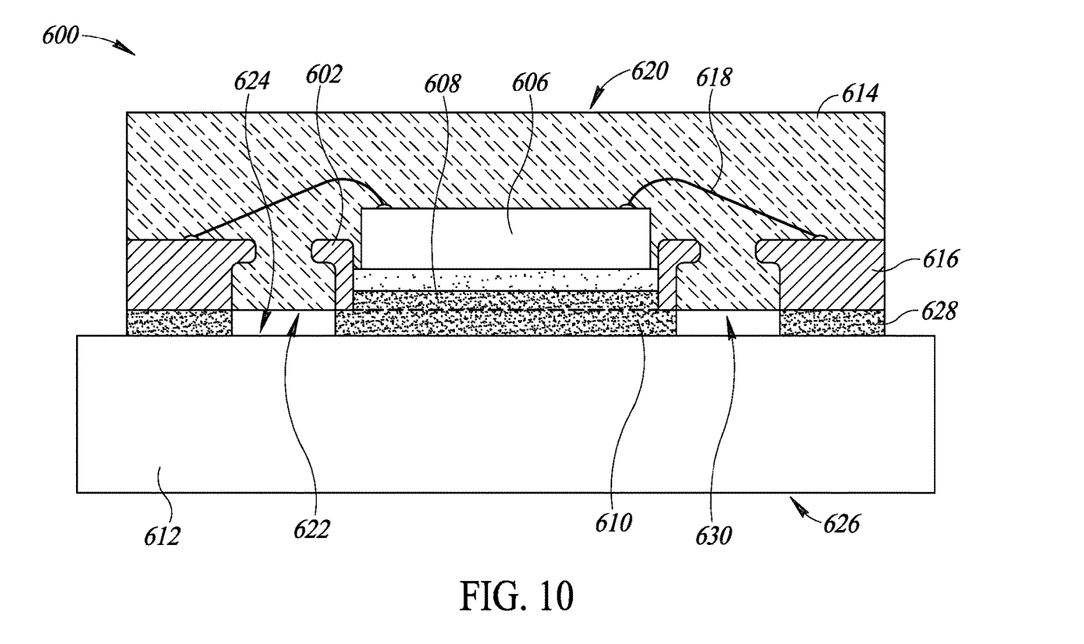
FIG. 10 is a cross-sectional view of the semiconductor package of FIG. 9 coupled to a substrate with an air gap between a surface of the semiconductor package and a surface of the substrate.

FIG. 10 illustrates the package 600 coupled to a substrate 612, which may be a printed circuit board (PCB), for example. The package 600 includes an encapsulant 614 formed over and surrounding the die 606, the die pad 602, a plurality of leads 616, and a plurality of wires 618 coupled between the die 606 and the leads 616. The encapsulant 614 includes a first surface 620 opposite as second surface 622. In one embodiment, the first surface 620 and the second surface 622 of the encapsulant are a first and second surface, respectively, of the package 600.

The substrate 612 includes a first surface 624 opposite a second surface 626 with a material 628 formed on the first surface 624 of the substrate 612. In one embodiment, the material 628 is pre-formed on the first surface 624 and is comprised of solder. For example, the material 628 may be a tin and lead solder, or a lead-free solder, such as a solder containing tin, silver, and copper, alone or in any combination. As shown in FIG. 10, a location of each portion of the material 628 on the substrate 612 corresponds to a location of the leads 616 and the die pad 602 of the package 600. As such, the substrate 612 is configured to receive the package 600. Preferably, the material 628 is of the same type as the second material 610 of the package 600. As such, when the package 600 is coupled to the substrate 612, the material 628 and the second material 610 of the package, which is exposed, are soldered together. The material 628 is also soldered to the leads 616 and the die pad 602. Because the materials 610, 628 are preferably of the same composition, the resulting combination forms a strong physical connection, which improves reliability of the coupling between the package 600 and the substrate 612. The first material 608 of the package 600 is preferably a different material, such as a tin and lead solder, that is compatible with the second material 610 and the material 628 on the substrate 612 as well as with the semiconductor material comprising the die 606. Moreover, the material 628 can be selected to be a material compatible with the leads 616 and the die pad 602, which are preferably formed of a metal, such as copper or a copper alloy, among other examples.

Once the package 600 is coupled to the substrate, the package 600 is spaced from the first surface 624 of the substrate 612 in areas where the material 628 is not present. In other words, there is an air gap 630 between the second surface 622 of the encapsulant 614 (and the package 600) and the first surface 624 of the substrate 612. In one embodiment, the second surface 622 of the encapsulant 614 faces the substrate 612 and the first surface 624 of the substrate 612 faces the package 600 and the encapsulant 614. As such, the air gap 630 is between a surface of the encapsulant 612 facing the substrate 612 and a surface of the substrate 612 facing the encapsulant 612. In one embodiment, the air gap 630 acts as an additional heat dissipation region, as heat transferred from the package 600 to the material 628 is dissipated in the air gap 630. In other words, the air gap 630 provides for air flow around the material 628 and the package 600, which naturally cools the package 600 and the substrate 612 via convection.

As such, embodiments of the present disclosure provide for semiconductor packages with a semiconductor die coupled to a die pad with a first material. The die pad includes a cavity or aperture extending through the die pad. Then, a solder reflow process is performed to remove solder voids in the first material that form during solidification of the first material when coupling the die to the die pad. A second material is then formed or deposited in the cavity on the first material. Preferably, the second material is coplanar with a surface of the package. The first and second materials may be the same or different types of solder, for example. As such, the packages described herein include solder on a surface of a package that is exposed to an ambient environment, wherein the solder does not include, or has a substantially reduced amount of, voids or trapped gas relative to known packages. The reduction in voids of trapped gas reduces the concentration of heat and power and enables more efficient heat transfer from the package to a substrate to which the package is coupled.

In the above description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with semiconductor devices and packages, such as QFN packages, have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense that is as meaning "and/or" unless the content clearly dictates otherwise.

The relative terms "approximately" and "substantially," when used to describe a value, amount, quantity, or dimension, generally refer to a value, amount, quantity, or dimension that is within plus or minus 5% of the stated value, amount, quantity, or dimension, unless the context clearly dictates otherwise. It is to be further understood that any specific dimensions of components or features provided herein are for illustrative purposes only with reference to the exemplary embodiments described herein, and as such, it is expressly contemplated in the present disclosure to include dimensions that are more or less than the dimensions stated, unless the context clearly dictates otherwise.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a lead frame having a first surface and a second surface, the lead frame including an aperture;
a die having a first surface and a second surface opposite to the first surface of the die, the second surface of the die being positioned between the first and second surfaces of the lead frame; and
a first material in the aperture and having a first surface and a second surface, the first surface of the layer of the first material being between the first and second surfaces of the lead frame and the second surface of the first material being coplanar with the second surface of the lead frame.

2. The device of claim 1 further comprising:
a plurality of wires coupled between the die and the lead frame; and
an encapsulant on the lead frame, the die, and the plurality of wires.

3. The device of claim 1 further comprising:
a second material in the aperture, the second material coupled between the die and the lead frame, the first material being on the second material.

4. The device of claim of claim 3 wherein the second material comprises a type of solder and the first material comprises the same type of solder.

5. The device of claim 3 wherein the second material comprises a first type of solder and the first material comprises a second type of solder different than the first type of solder.

6. The device of claim 1 wherein the lead frame includes a die pad and a plurality of leads, the aperture being through the die pad.

7. The device of claim 6 wherein the die pad includes sidewalls and the die includes sidewalls spaced from sidewalls of the die pad by a gap.

8. The device of claim 6 wherein the die pad includes a perimeter edge and an area defined by the perimeter edge, the area of the die pad being greater than an area of the aperture in the die pad.

9. The device of claim 6 wherein the die pad includes a perimeter edge and an area defined by the perimeter edge, the area of the die pad being equal to an area of the aperture in the die pad.

10. A device, comprising:
   a die pad having a first surface opposite a second surface, the die pad including:
      a cavity extending through the die pad from the first surface to the second surface;
      a sidewall extending from the first surface to the second surface;
      a first material in the cavity and coupled to the sidewall of the die pad;
      a second material in the cavity on the first material; and
      a semiconductor device coupled to the first material.

11. The device of claim 10 wherein the first material and the second material are the same.

12. The device of claim 10 wherein the first material is different from the second material.

13. The device of claim 10 further comprising:
   a plurality of leads spaced from the die pad area;
   a plurality of wires coupled between the semiconductor device and the plurality of leads; and
   an encapsulant on the die pad area, the plurality of leads, the semiconductor device, and the plurality of wires.

14. The device of claim 13 wherein the encapsulant includes a surface, the device further comprising:
   a substrate having a surface, the die pad area and the plurality of leads coupled to the surface of the substrate, the surface of the encapsulant facing the surface of the substrate; and
   an air gap between the surface of the substrate and the surface of the encapsulant.

15. A method, comprising:
   coupling a semiconductor device to a die pad in a cavity of the die pad with a first material, coupling the semiconductor device including forming the first material in the cavity on a first surface of the die pad opposite a second surface of the die pad;
   forming an aperture through the die pad from the second surface to the first surface; and
   forming a second material in the cavity of the die pad on the first material, the forming including forming the solder layer coplanar with the second surface of the die pad.

16. The method of claim 15 wherein forming the second material includes reflowing the first material to release air voids in the material and forming the second material on the reflowed first material coplanar with the second surface of the die pad.

17. The method of claim 15 further comprising, before forming the aperture:
   coupling a plurality of wires between the semiconductor device and a plurality of leads spaced from the die pad; and
   encapsulating the die pad, the plurality of leads, the plurality of wires, and the semiconductor device with molding compound.

18. The method of claim 15 wherein coupling the semiconductor device to the die pad with the first material includes coupling the semiconductor device to the die pad with a first solder and forming the solder layer includes forming the solder layer with a second solder different from the first solder material.

19. The method of claim 15 wherein coupling the semiconductor device to the die pad with the first material includes coupling the semiconductor device to the die pad with a type of solder and forming the solder layer includes forming the solder layer from the type of solder.

20. The method of claim 15 wherein forming the aperture through the pad includes forming a plurality of vent holes through the die pad from the second surface to the first surface, the aperture being one of the apertures of the plurality of apertures.

* * * * *